(12) United States Patent
Shimada

(10) Patent No.: US 10,636,708 B2
(45) Date of Patent: Apr. 28, 2020

(54) METHOD OF MANUFACTURING SEMICONDUCTOR DEVICE

(71) Applicant: FUJI ELECTRIC CO., LTD., Kawasaki-shi (JP)

(72) Inventor: Takashi Shimada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/253,503

(22) Filed: Jan. 22, 2019

(65) Prior Publication Data

US 2019/0287856 A1 Sep. 19, 2019

(30) Foreign Application Priority Data

Mar. 14, 2018 (JP) ................................. 2018-047297

(51) Int. Cl.
| | |
|---|---|
| H01L 21/82 | (2006.01) |
| H01L 21/02 | (2006.01) |
| H01L 21/304 | (2006.01) |
| H01L 29/16 | (2006.01) |
| H01L 21/04 | (2006.01) |

(52) U.S. Cl.
CPC .... H01L 21/8213 (2013.01); H01L 21/02378 (2013.01); H01L 21/3043 (2013.01); H01L 29/1608 (2013.01); *H01L 21/0485* (2013.01); *H01L 21/0495* (2013.01)

(58) Field of Classification Search
CPC ...................... H01L 21/02378; H01L 21/3043
See application file for complete search history.

(56) References Cited

U.S. PATENT DOCUMENTS

| | | | |
|---|---|---|---|
| 2010/0164032 A1* | 7/2010 | Kita | H01L 27/14618 257/432 |
| 2018/0166328 A1* | 6/2018 | Tang | H01L 23/481 |
| 2019/0267288 A1* | 8/2019 | Masuko | H01L 24/32 |

FOREIGN PATENT DOCUMENTS

| | | |
|---|---|---|
| JP | 2013-161944 A | 8/2013 |
| JP | 2013-236018 A | 11/2013 |
| JP | 2014-13812 A | 1/2014 |
| JP | 2016-209998 A | 12/2016 |

\* cited by examiner

*Primary Examiner* — Caridad Everhart
*Assistant Examiner* — Ankush K Singal

(57) ABSTRACT

Along dicing lines, cutting grooves that reach a rear surface from a front surface are formed by a first dicing blade in a semiconductor wafer, completely separating the semiconductor wafer into individual semiconductor chips by the cutting grooves. Thereafter, by a second dicing blade that is constituted by abrasive grains having a mean grit size smaller than that of the first dicing blade and that has a blade width wider than that of the first dicing blade, side walls of the cutting grooves, i.e., side surfaces of the semiconductor chips are polished, approaching a specular state.

15 Claims, 9 Drawing Sheets

FIG.8

| PROCESS STEP | CONDITION | CONVENTIONAL EXAMPLE | EXAMPLE | COMPARISON EXAMPLE |
|---|---|---|---|---|
| FIRST STAGE | BLADE WIDTH | 40 μm | 40 μm | 50 μm |
| | MESH SIZE | #2000 | #2000 | #2500 |
| | BLADE ROTATIONAL SPEED | 8000 rpm | 8000 rpm | 50000 rpm |
| | ULTRASONIC OUTPUT | 20 W | 20 W | - |
| | CUTTING SPEED | 10 mm/s | 20 mm/s | 2 mm/s |
| SECOND STAGE | BLADE WIDTH | - | 45 μm | - |
| | MESH SIZE | - | #3000 | - |
| | BLADE ROTATIONAL SPEED | - | 8000 rpm | - |
| | ULTRASONIC OUTPUT | - | 0 W | - |
| | CUTTING SPEED | - | 20 mm/s | - |
| | REQUIRED DICING TIME PER SINGLE WAFER | 90 MINUTES | 90 MINUTES | 240 MINUTES |
| | AVERAGE CHIP BENDING FRACTURE STRENGTH (450 μm) | 845 MPa | 1359 MPa | 1154 MPa |

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2018-047297, filed on Mar. 14, 2018, the entire contents of which are incorporated herein by reference.

BACKGROUND

1. Field

Embodiments of the invention related to a method of manufacturing a semiconductor device.

2. Description of Related Art

Silicon carbide (hereinafter, indicated as SiC) has characteristics in that as compared to silicon (hereinafter, indicated as Si), SiC has a bandgap that is about 3 times higher than that of Si, dielectric breakdown field strength that is about 10 times higher than that of Si, and electron saturation velocity that is about 2 times higher than that of Si. Therefore, use of SiC as a semiconductor material enables fabrication (manufacture) of a semiconductor device that has lower ON resistance and that is capable of high-speed operation and operation under high-temperature (e.g., 175 degrees C. or higher) environments. Further, use of a SiC semiconductor device in a power control device such as an inverter enables reductions in size and power consumption of the device and therefore, development of SIC semiconductor devices and development of devices incorporating SIC semiconductor devices are advancing.

In this manner, compared to Si, which is commonly used as a semiconductor material, SiC has a feature of contributing to enhancement of the characteristics of the semiconductor device. However, SiC also has a problem in that SiC is extremely hard and chemically stable, thereby making SiC difficult to process. For example, a semiconductor device is fabricated by forming an element structure and/or electrode film in each effective region of a semiconductor wafer, the effective regions each constituting a semiconductor chip; and after forming the element structure and/or electrode film, the semiconductor wafer is cut into individual chips by a cutting process called dicing. Here, when typical dicing is performed using a dicing blade, there is a risk that the dicing blade may not withstand cutting resistance generated between the semiconductor wafer and the dicing blade.

Typical dicing using a dicing blade is dicing that is generally performed when a semiconductor device is fabricated using a semiconductor wafer having Si as a semiconductor material, and that uses a dicing blade formed by hardening diamond grit by electroforming. In particular, for each linear dicing line provided in a grid-like layout, surrounding a periphery of an effective region that constitutes a semiconductor chip in a semiconductor wafer, typical dicing using a dicing blade involves performing a single-session (1-stage) cutting process (single cut) using the dicing blade, and forming a cutting groove at a depth penetrating the semiconductor wafer in a thickness direction, the cutting groove having a width equal to a blade width of the dicing blade.

To suppress the problems above, the load on the dicing blade due to the cutting resistance has to be reduced. As a method of reducing the load on the dicing blade, in combination with a 2-stage cutting process called a step-cut, the cutting speed of the dicing blade is reduced to ⅒ or less than that in a case of dicing a semiconductor wafer having Si as a semiconductor material (for example, refer to Japanese Laid-Open Patent Publication No. 2013-161944). In Japanese Laid-Open Patent Publication No. 2013-161944, a method is proposed in which after a cutting groove of a depth penetrating an electrode film is formed by a first dicing blade, the cutting groove is further cut by a second dicing blade that has a width that is narrower than that of an opening of the cutting groove, whereby the semiconductor wafer is cleaved.

Nonetheless, when the cutting speed of the dicing blade is reduced and the semiconductor wafer is diced, a new problem arises in that semiconductor chip productivity becomes extremely low. Thus, as a method of increasing the cutting speed of the dicing blade and reducing the load on the dicing blade due to cutting resistance when a semiconductor wafer is diced, a method has been proposed where a micro-crack is formed by tapping a cutting groove formation site of the semiconductor wafer with a dicing blade that is vibrated in a direction orthogonal to a main surface of the semiconductor wafer by applying ultrasonic vibration, where the depth of the cutting groove is increased (for example, refer to Japanese Laid-Open Patent Publication No. 2013-236018, Japanese Laid-Open Patent Publication No. 2016-209998, and Japanese Laid-Open Patent Publication No. 20121-013812).

SUMMARY

According to an embodiment of the present invention, a method of manufacturing a semiconductor device that uses a semiconductor wafer containing silicon carbide and having a first main surface where a dicing e is formed in a predetermined layout that surrounds a periphery of a region constituting a semiconductor chip, includes fixing the semiconductor wafer o a stage, in a state with a second main surface of the semiconductor wafer opposing the stage; forming a cutting groove by a first dicing blade, the cutting groove being formed in the semiconductor wafer, along the dicing line and reaching the second main surface from the first main surface, the semiconductor wafer being cut via the cutting groove and separated into the semiconductor chip whose periphery is surrounded by the cutting groove; and polishing a side wall of the cutting groove along the dicing line, the side wall being a side surface of the semiconductor chip and polished by a second dicing blade inserted in the cutting groove. Polishing the side wall includes using the second dicing blade that has a blade width wider than that of the first dicing blade.

In the embodiment, polishing the side wall includes using the second dicing blade constituted by abrasive grains having a mean grit size smaller than that of the first dicing blade.

In the embodiment, forming the cutting groove includes applying ultrasonic vibration to the first dicing blade, and forming the cutting groove by the first dicing blade vibrated in a direction orthogonal to the first main surface of the semiconductor wafer.

In the embodiment, forming the cutting groove includes separating the semiconductor wafer into the semiconductor chip that the side surface that is flat.

In the embodiment, a rotational speed of the second dicing blade is higher than a rotational speed of the first dicing blade.

In the embodiment, a cutting speed of the second dicing blade is equal to a cutting speed of the first dicing blade.

In the embodiment, a cutting speed of the second dicing blade is lower than a cutting speed of the first dicing blade.

In the embodiment, in polishing the side wall, the side wall of the cutting groove approaches a specular state.

In the embodiment, a blade width of the second dicing blade is wider than a blade width of the first dicing blade by a range from +2 μm to +15 μm.

In the embodiment, the blade width of the second dicing blade is wider than the blade width of the first dicing blade by a range of +3 μm to +7 μm.

In the embodiment, a mesh size for the first dicing blade is in range from #1500 to #2500. A mesh size for the second dicing blade is in a range from #3000 to #4000.

In the embodiment, forming the cutting groove includes using the first dicing blade constituted by diamond grit.

In the embodiment, polishing the side wall includes using the second dicing blade constituted by diamond grit.

In the embodiment, fixing the semiconductor wafer to the stage includes: adhering the second main surface of the semiconductor wafer to a dicing frame via dicing tape, and fixing the semiconductor wafer to the stage via the dicing frame. Forming the cutting groove includes deepening a depth of the cutting groove until a cut by the first dicing blade enters the dicing tape.

In the embodiment, the method further includes before fixing the semiconductor wafer to the stage, forming a predetermined element structure in the region constituting the semiconductor chip; forming the dicing line at the first main surface of the semiconductor wafer; selectively forming at the first main surface of the semiconductor wafer, a first electrode film in the region constituting the semiconductor chip; and forming a second electrode film on the entire second main surface of the semiconductor wafer.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is a table depicting a relationship of a required dicing time per unit number of semiconductor wafers and bending fracture strength of semiconductor chips; and.

DESCRIPTION OF EMBODIMENTS

Figure 1:
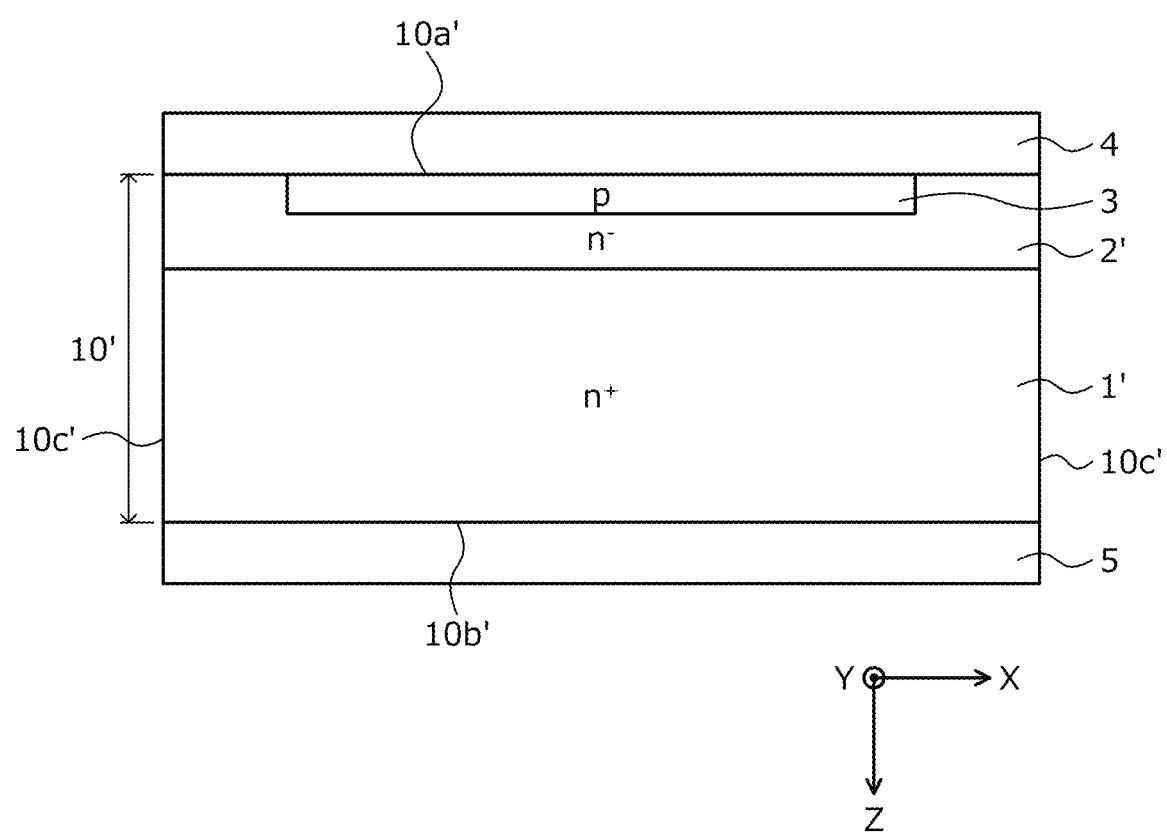
FIG. 1 is a cross-sectional view of an example of a semiconductor device manufactured by a method of manufacturing a semiconductor device according to an embodiment.

First, problems associated with the related techniques will be discussed. Through diligent research, the inventors found the following. In the dicing that combines ultrasonic vibration like that in Japanese Laid-Open Patent Publication No. 2013-236018, Japanese Laid-Open Patent Publication No. 2016-209998, and Japanese Laid-Open Patent Publication No. 2014-013812, the dicing blade is vibrated in a direction orthogonal to the main surface of the semiconductor wafer by applying ultrasonic vibration, whereby the dicing blade forms micro-cracks at the bottom of the cutting groove and thereby increases the depth of the cutting groove, shortening the cutting time for the cutting groove and enhancing semiconductor chip productivity. During this dicing, the dicing blade further vibrates in a direction parallel to the main surface of the semiconductor wafer, at an amplitude of 1/10 of the vibration in the direction orthogonal to the main surface of the semiconductor wafer. Therefore, at a side wall of the cutting groove, the side wall that constitutes a side surface of a semiconductor chip, diamond grit of the dicing blade form micro-cracks that are recesses of about 100 nm to 200 nm.

In this manner, the semiconductor chip cleaved from the semiconductor wafer is incorporated in a resin case of a semiconductor module. The semiconductor module is fabricated by sealing the semiconductor chip with a resin after disposing lead-out wiring from the semiconductor chip mounted in a resin case. During operation of a semiconductor device formed by the semiconductor chip, the semiconductor module overall is deformed by thermal contraction due to operation heat of the semiconductor device, whereby the semiconductor chip in the semiconductor module is subject to bending stress. When this bending stress caused by the deformation of the semiconductor module is repeatedly applied to the semiconductor chip, micro-cracks formed at a boundary of the main surface and the side surface (side wall of the cutting groove) of the semiconductor chip may become origins from which the cracks expand, damaging the semiconductor chip.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

As an example of a semiconductor device fabricated (manufactured) by the method of manufacturing a semiconductor device according to an embodiment, a structure of a Schottky barrier diode (SBD) will be described. FIG. 1 is a cross-sectional view of an example of a semiconductor device manufactured by the method of manufacturing a semiconductor device according to the embodiment. The semiconductor device according to the embodiment and depicted in FIG. 1 is a SBD fabricated using a semiconductor chip 10' having silicon carbide (SiC) as a semiconductor material. The semiconductor chip 10' is an epitaxial substrate in which an n$^-$-type SiC layer 2' is formed by epitaxial growth on a front surface of the n$^+$-type starting substrate 1' made from SiC.

The front surface of the n$^+$-type starting substrate 1' may be a (0001) plane, a so-called Si-face, or may be a (000-1) plane, a so-called C-face. Here, a case in which the front surface of the n$^-$-type starting substrate 1' is a Si-face will be described as an example. Further, description is given assuming that the semiconductor chip 10' has opposite sides including an n⁻-type SiC layer 2' side and an n⁺type starting substrate 1' side; and a surface of the semiconductor chip 10' on the n⁻-type SiC layer 2' side is a front surface 10a' and a surface (i.e., rear surface of the n⁻-type starting substrate 1') of the semiconductor chip 10' on the n⁺-type starting substrate 1' side is a rear surface 10b'. A side surface 10c' of the semiconductor chip 10' is a side wall of a cutting groove 14 formed when the semiconductor wafer is diced. The side surface 10c' of the semiconductor chip 10' is polished during dicing of the semiconductor wafer described hereinafter and is substantially specular.

In a surface layer at the front surface 10a' of the semiconductor chip 10', a p-type region 3 is selectively provided in the n⁻-type SiC layer 2', separated from the n⁺-type starting substrate 1'. The p-type region 3, for example, is provided spanning an active region overall. The active region is a region through which current flows when an element is in an ON state. An edge termination region that surrounds a periphery of the active region is provided. The edge termination region is a region between an active region 11 and a side surface of the semiconductor chip 10' and is a region in which a predetermined breakdown voltage structure is disposed and that is for mitigating electric field at a front surface side of the semiconductor chip 10' and maintaining breakdown voltage (withstand voltage). The breakdown voltage is a voltage limit at and below which errant operation or destruction of the element does not occur.

A first electrode film 4 is provided on the front surface 10a' of the semiconductor chip 10', is in contact with the p-type region 3 and the n⁻-type SiC layer 2', and is electrically connected with the p-type region 3 and the type SiC layer 2'. By a junction of the first electrode film 4 and the n⁻-type SiC layer 2', a diode demonstrating a rectifying action by a Schottky contact of the first electrode film 4 and the n⁻-type SiC layer 2' is formed. A second electrode film 5 is provided at the rear surface 10b' of the semiconductor chip 10' overall and forms an ohmic contact with the n-type starting substrate 1'. The second electrode film 5, for example, is a contact (electrical contact part) in contact with a conductive plate that configures a circuit pattern on a non-depicted insulated substrate.

Figure 2:
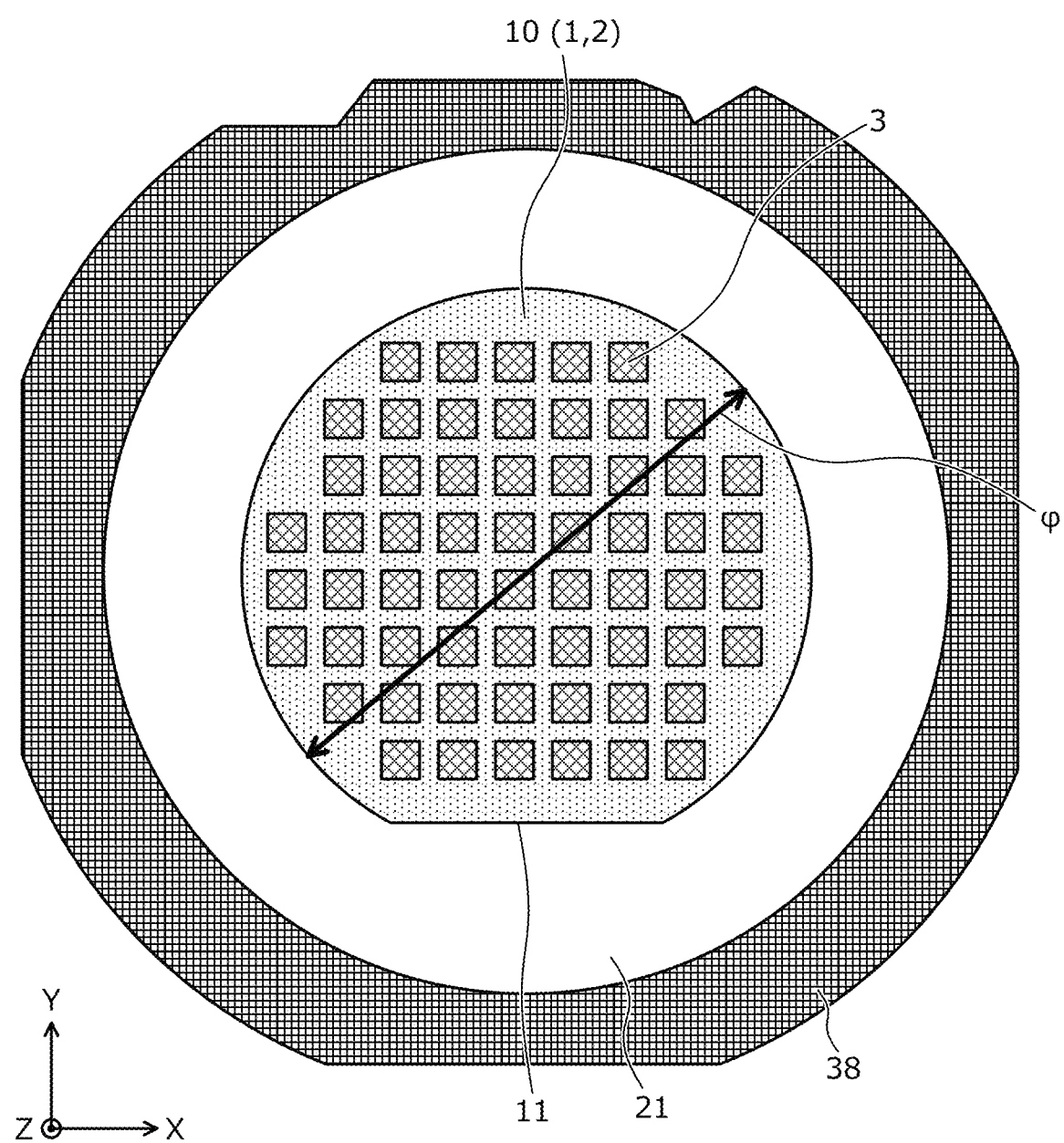
FIG. 2 is a plan view of the semiconductor device according to the embodiment during manufacture.
Figure 3:
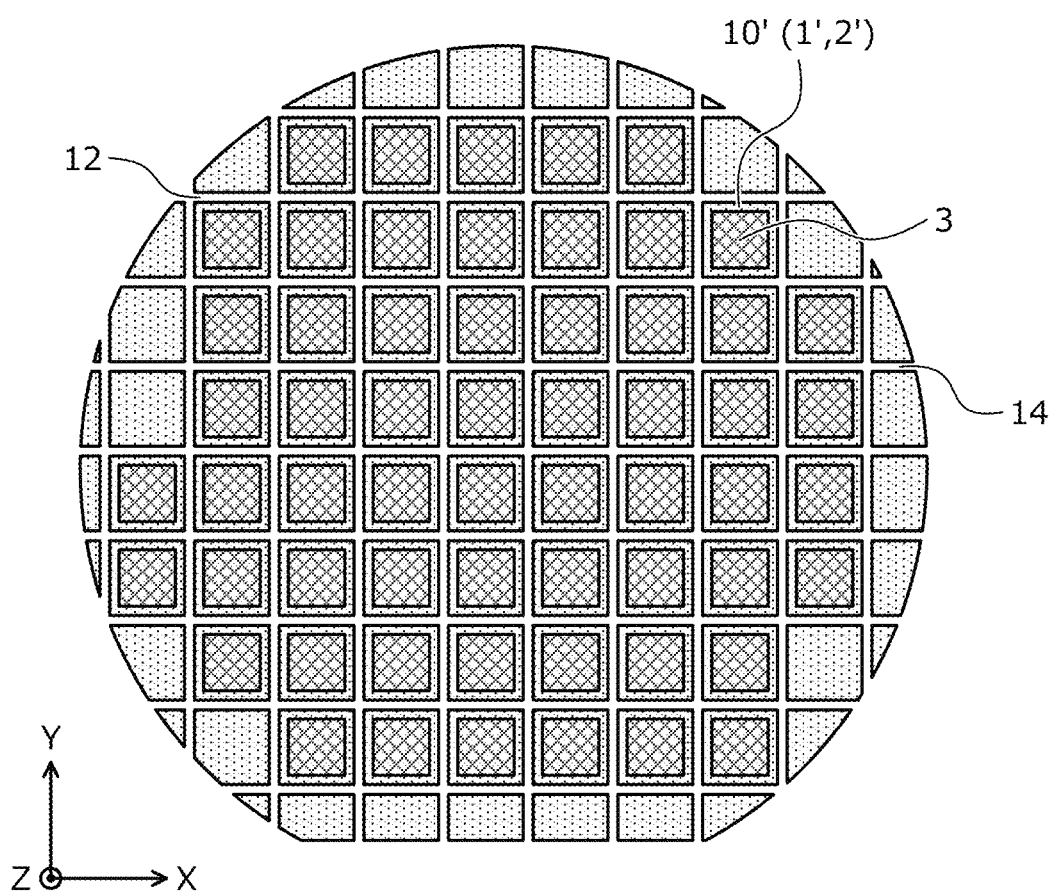
FIG. 3 is a plan view of the semiconductor device according to the embodiment during manufacture.

The method of manufacturing the semiconductor device according to the embodiment will be described. FIGS. 2 and 3 are plan views of the semiconductor device according to the embodiment during manufacture. FIGS. 4, 5, 6, and 7 are cross-sectional views of the semiconductor device according to the embodiment during manufacture. FIGS. 2 and 3 depict a layout of parts as viewed from a front surface side of a semiconductor wafer 10. FIG. 2 depicts a layout of the p-type region 3 provided in each region constituting the semiconductor chip 10'. A region between adjacent p-type regions 3 is the edge termination region. FIG. 3 depicts a state in which the semiconductor wafer 10 depicted in FIG. 2 has been diced and thereby cut into the individual semiconductor chips 10' of a predetermined size.

Figure 4:
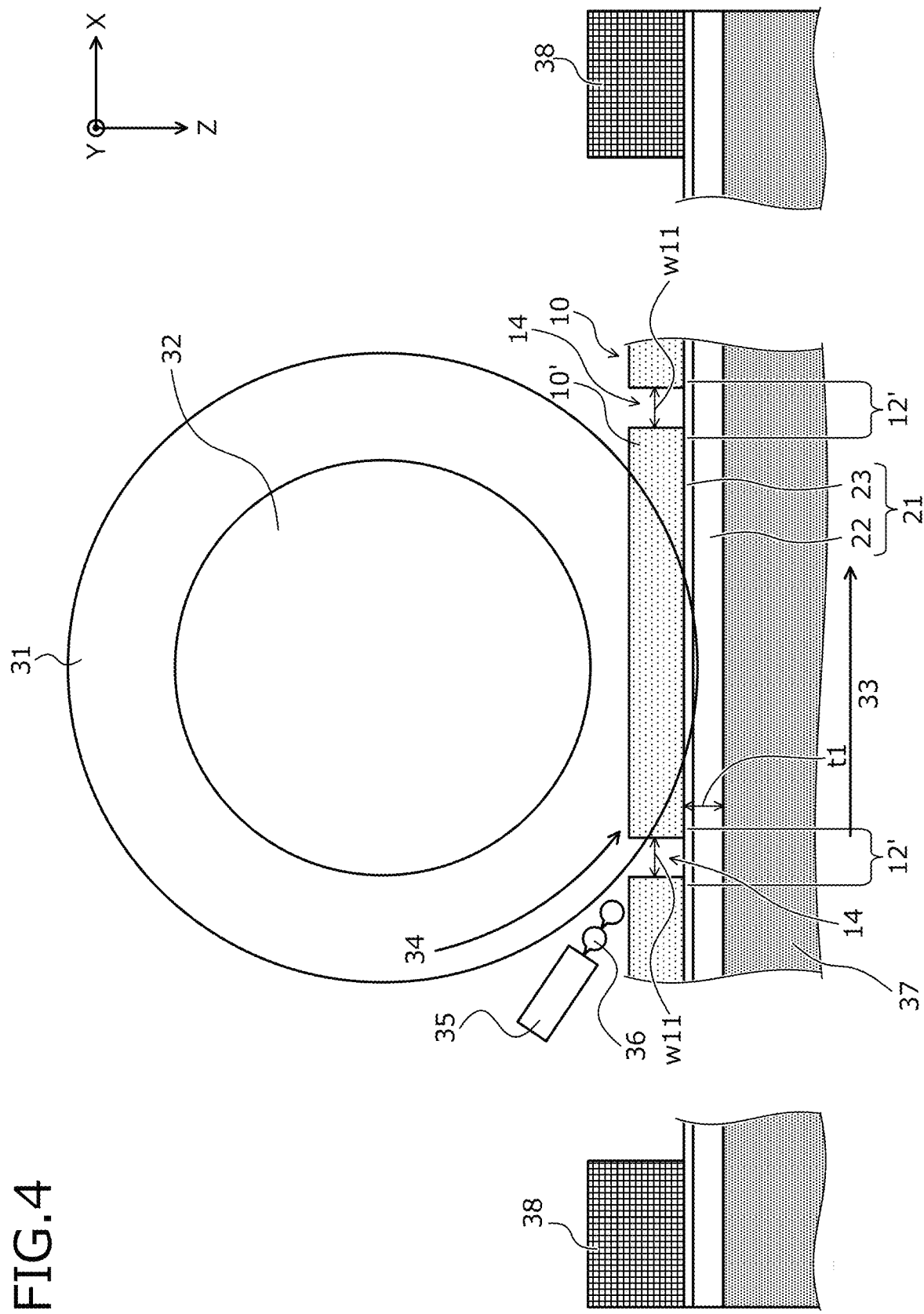
FIG. 4 is a cross-sectional view of the semiconductor device according to the embodiment during manufacture.
Figure 5:
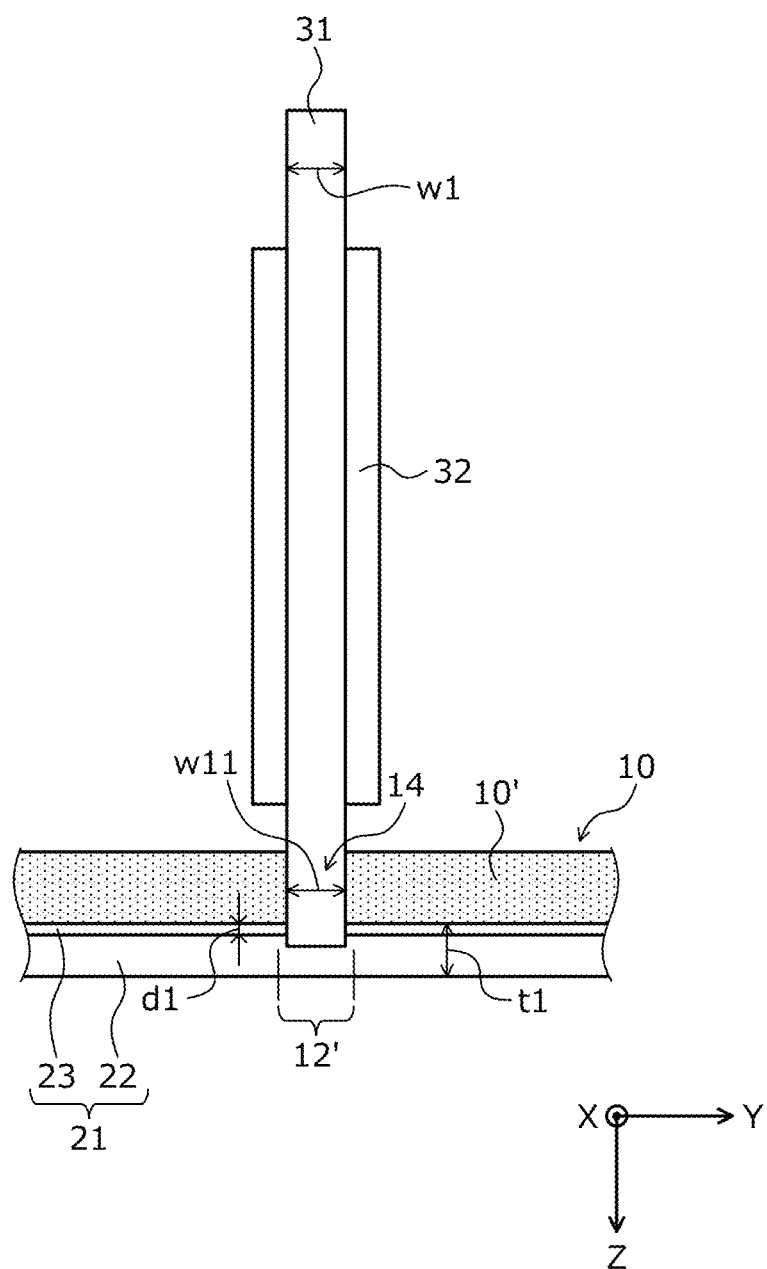
FIG. 5 is a cross-sectional view of the semiconductor device according to the embodiment during manufacture.
Figure 6:
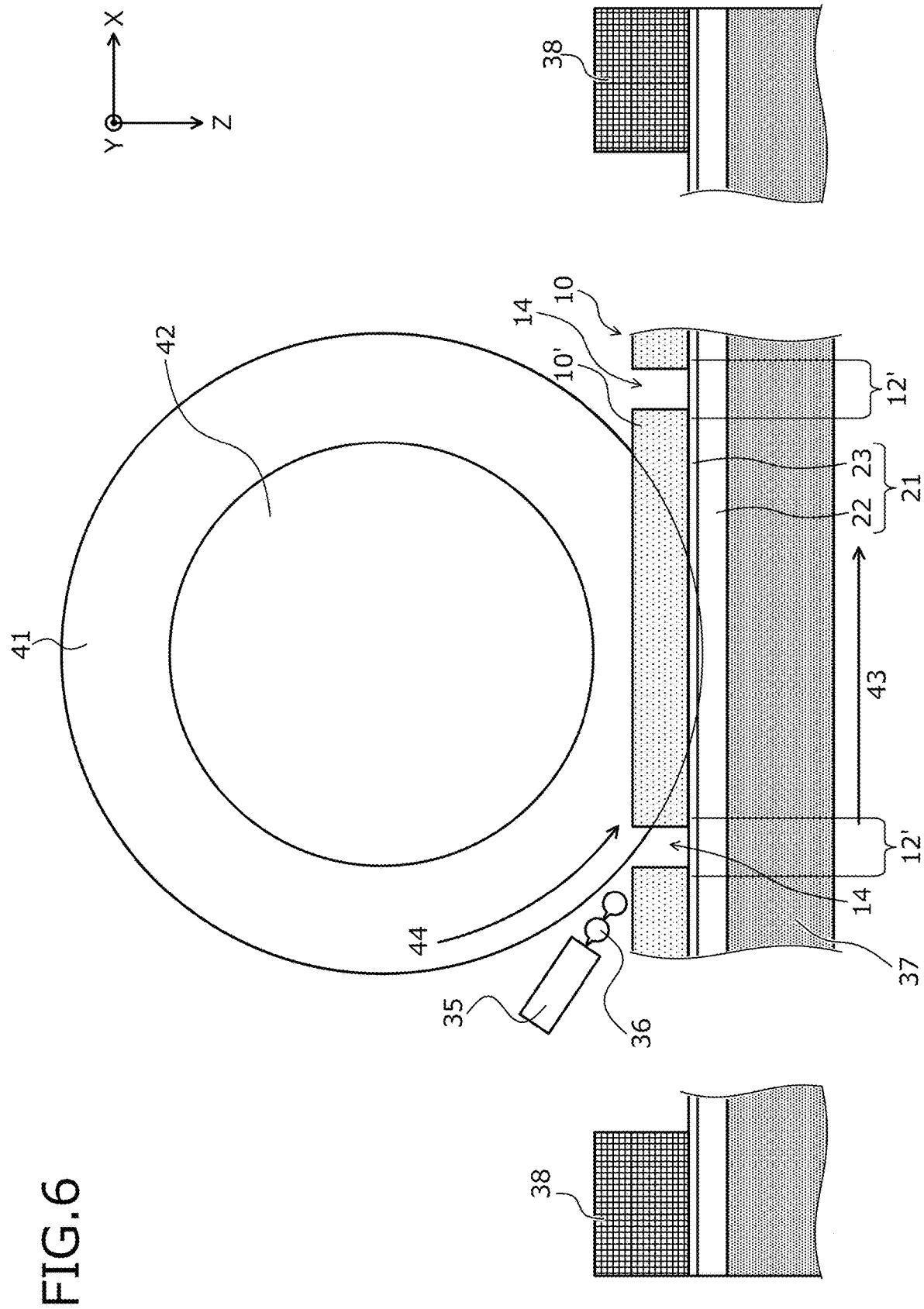
FIG. 6 is a cross-sectional view of the semiconductor device according to the embodiment during manufacture.
Figure 7:
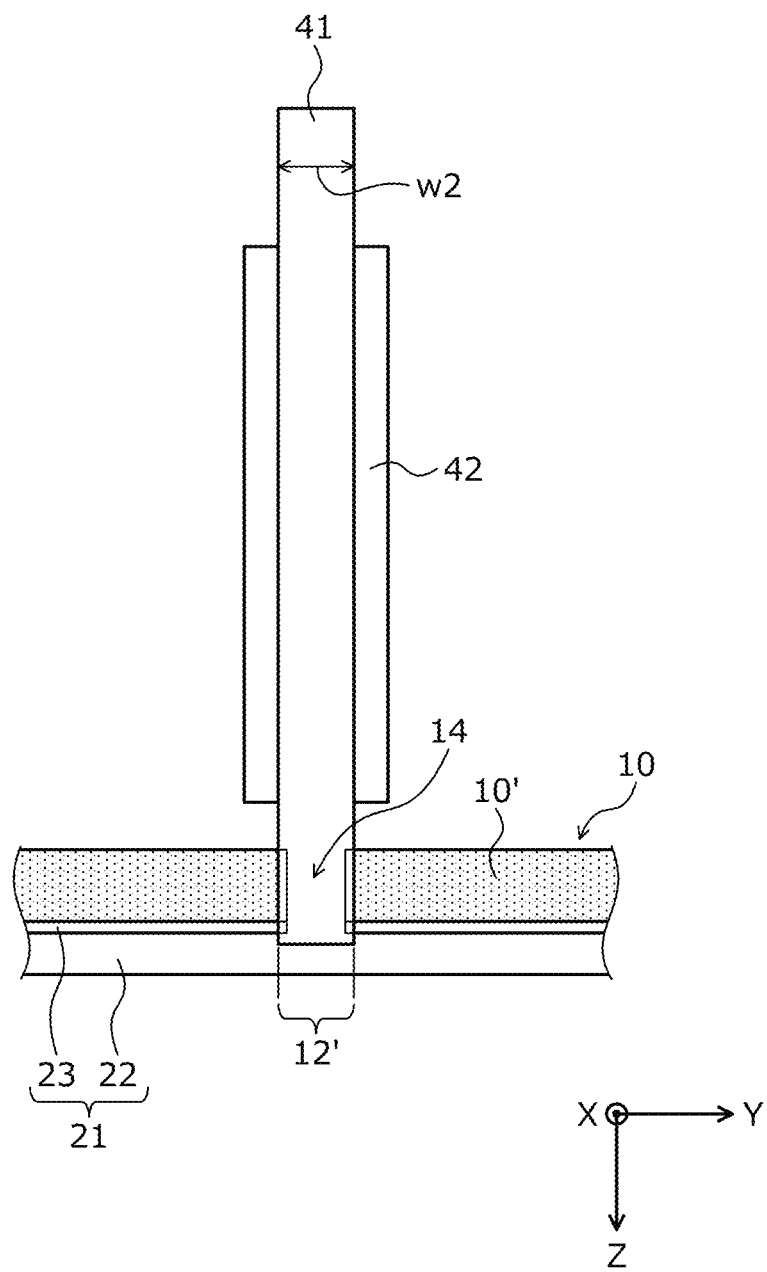
FIG. 7 is a cross-sectional view of the semiconductor device according to the embodiment during manufacture.

FIG. 4 schematically depicts a state during a first dicing as viewed from a direction (hereinafter, side surface of a dicing blade) orthogonal to a movement direction 33 of a stage 37 of a dicing machine. FIG. 5 schematically depicts a state during the first dicing as viewed from the movement direction 33 (hereinafter, front of the dicing blade) of the stage 37 of the dicing machine. FIG. 6 schematically depicts a state during a second dicing as viewed from a side surface of a second dicing blade. FIG. 7 schematically depicts a state during the second dicing as viewed from a front of the second dicing blade. In the present embodiment, a general dicing machine may be used and in FIGS. 4 to 7, only a part of the configuration of the dicing machine is depicted.

First, as depicted in FIG. 2, an n⁺-type starting wafer 1 made from SIC and doped with an n-type impurity such as, for example, nitrogen (N) is prepared. A diameter φ of the n⁺-type starting wafer 1 may be, for example, 6 inches. Next, the semiconductor wafer 10 is fabricated by forming an n⁻-type SIC layer 2 by epitaxial growth on a Si-face that is a front surface (first main surface) of the n⁺-type starting wafer 1. FIG. 2 depicts the semiconductor wafer 10 in which an orientation flat is formed. The semiconductor wafer 10 has opposite sides including an n⁻-type SIC layer 2 side and an n⁺-type starting wafer 1 side, a surface of the semiconductor wafer 10 on the n⁻-type SiC layer 2 side being assumed as a front surface and a surface (i.e., rear surface of the n⁺-type starting wafer 1) of the semiconductor wafer 10 on the n⁺-type starting wafer 1 side being assumed as a rear surface (second main surface).

Next, after a p-type impurity such as aluminum (Al) is ion implanted from the surface of the n⁻-type SIC layer 2, an annealing process (heat treatment) for activating the impurity is performed, forming the p-type region 3 in a surface layer of the n⁻-type SIC layer 2. The p-type region 3 is formed in each effective region of the semiconductor wafer 10, an effective region constituting the semiconductor chip 10' (refer to FIG. 1). The effective regions of the semiconductor wafer 10 and constituting the semiconductor chips 10', for example, are disposed in a layout having a matrix shape as viewed from a front surface side of the semiconductor wafer 10. At a front surface of the semiconductor wafer 10, a dicing line 12 (refer to FIG. 3) is formed between effective regions constituting the semiconductor chips 10' as described hereinafter.

Next, grinding from a C-plane side that is the rear surface of the semiconductor wafer 10 is performed, reducing a thickness of the semiconductor wafer 10 to, for example, about 300 µm, which is a product thickness used for a semiconductor device. Next, on the front surface of the semiconductor wafer 10, the first electrode film 4 (refer to FIG. 1) forming a Schottky contact with the p-type region 3 is formed. The first electrode film 4, for example, is formed only in a predetermined region of the semiconductor wafer 10, in effective regions constituting the semiconductor chips 10'. The front surface of the semiconductor wafer 10. at a part other than a part where the first electrode film 4 is formed, is covered by an insulating film. On the rear surface of the semiconductor wafer 10, the second electrode film 5 (refer to FIG. 1) forming an ohmic contact with the n⁺-type starting wafer 1 is formed.

In this manner, on a single wafer of the semiconductor wafer 10, multiple semiconductor devices are formed. The semiconductor devices are electrically insulated from each other by an insulating film that covers the front surface of the semiconductor wafer 10, between effective regions constituting the semiconductor chips 10'. In an effective region constituting the semiconductor chip 10', a predetermined breakdown voltage structure may be formed in the edge termination region that surrounds a periphery of the active region. The effective regions constitute the semiconductor chips 10', and between the effective regions of the semiconductor wafer 10 is an inactive region that is not used as a semiconductor chip and in the inactive region, the dicing line 12 (refer to FIG. 3) is formed. The dicing line 12 becomes a kerf when the semiconductor wafer 10 is diced (cleaved).

For example, on the front surface of the semiconductor wafer 10, the dicing line 12 is formed in plural and in straight lines along first and second directions X, Y that are orthogonal to each other and parallel to the front surface of the semiconductor wafer 10, the dicing lines 12 being formed so as to surround in a grid pattern, a periphery of each of the effective regions constituting the semiconductor chips 10'. Next, as depicted in FIG. 3, the semiconductor wafer 10 is diced along the dicing lines 12 and separated into the individual semiconductor chips 10' each having a chip shape. Dicing and separation of the semiconductor wafer 10 is the cutting of each of the effective regions from the semiconductor wafer 10, the effective regions having a substantially rectangular planar shape and constituting the semiconductor chips 10'.

The semiconductor wafer 10 is separated into the semiconductor chips 10' in two stages including first-stage dicing (hereinafter, the first dicing) and second-stage dicing (hereinafter, the second dicing), The first and second dicings are performed using a general dicing machine and under differing dicing conditions. The first dicing is a process of using a first dicing blade 31 to completely cleave and separate the semiconductor wafer 10 along the dicing lines 12 into the individual semiconductor chips 10'. The second dicing is a process of polishing the side surfaces of each of the semiconductor chips 10' using a second dicing blade 41 having a blade width w2 that is wider than that of the first dicing blade 31.

In particular, first, as depicted in FIGS. 4 and 5, the rear surface of the semiconductor wafer 10 is adhered to a dicing tape 21, the semiconductor wafer 10 is adhered and fixed to a dicing frame 38, via the dicing tape 21. The dicing tape 21 is constituted by a substrate 22 and an adhesive layer 23. The dicing tape 21 is applied to the semiconductor wafer 10 with the adhesive layer 23 facing toward the semiconductor wafer 10. Next, the semiconductor wafer 10 is placed on the stage 37 of the general dicing machine, with the rear surface of the semiconductor wafer 10 facing toward the stage 37, via the dicing tape 21 that is affixed to the dicing frame 38. Next, the rear surface of the semiconductor wafer 10 is adhered and fixed to the stage 37 by a vacuum chuck of the stage 37, the vacuum chuck being disposed at the surface where the semiconductor wafer 10 is placed.

Next, the first dicing blade 31 is used to form along the dicing lines 12, the cutting grooves 14 that penetrate the semiconductor wafer 10 in a thickness direction Z, and completely cleave the semiconductor wafer 10 (hereinafter, the first dicing). In FIGS. 4 and 5, reference numeral 12' is a formation region of the cutting grooves 14 in the semiconductor wafer 10. i.e., a region in which the dicing line 12 is formed at the front surface (similarly in FIGS. 6 and 7).

In particular, the first dicing is performed as follows. The first dicing blade 31 is, for example, a thin, disk-shaped grinding wheel having diamond grit (diamond particles) hardened by general electroforming. The first dicing blade 31, in a state enabling rotation around a non-depicted first spindle as an axis of rotation, is fixed to the first spindle, via a first blade horn 32. The first blade horn 32 is disposed at a center of the first dicing blade 31 so as to sandwich the first dicing blade 31 with the first blade horn 32 being in contact with both side surfaces of the first dicing blade 31 and fixing the first dicing blade 31 to the first spindle. The side surfaces of the first dicing blade 31 are surfaces that are orthogonal to a direction of a blade width w1 of the first dicing blade 31. The first blade horn 32 has a function of reinforcing the strength of the first dicing blade 31 along the direction of the blade width w1. The first blade horn 32, for example, has a disk-like shape having a radius that is about 1.5 mm smaller than a radius of the first dicing blade 31.

During the first dicing, the first dicing blade 31 is arranged so that the side surfaces of the first dicing blade 31 are parallel to the dicing lines 12 and the first dicing blade 31 is rotated a high speed by the first spindle, via the first blade horn 32, Additionally, ultrasonic vibration is applied to the first dicing blade 31 from the first spindle, via the first blade horn 32, vibrating the first dicing blade 31 at a predetermined amplitude (e.g., around 2 µm) in a radial direction (i.e., direction orthogonal to the main surface of the semiconductor wafer 10). Application of ultrasonic vibration and causing the first dicing blade 31 to vibrate enables prevention of clogging of the first dicing blade 31 due to cutting debris.

The first dicing blade 31 vibrated in this manner is pressed against the dicing line 12, whereby a formation site of the cutting groove 14 is struck and crushed by projections of the abrasive grains on the surfaces of the first dicing blade 31, forming micro-cracks at the formation site of the cutting groove 14, whereby the cutting groove 14 is formed. Further, the first dicing blade 31 is lowered toward the stage 37, whereby a bottom of the cutting groove 14 is struck by the projections of the abrasive grains on the surfaces of the first dicing blade 31 and is thereby crushed, forming micro-cracks at the bottom of the cutting groove 14 and increasing a depth of the cutting groove 14. As a result, the cutting groove 14 is formed penetrating the semiconductor wafer 10 in a depth direction Z. The cutting groove 14 is formed along all the dicing lines 12.

In particular, the stage 37 is moved along a same direction as a direction along which the dicing line 12 extends in a straight line, whereby the first dicing blade 31 that is vibrated as described above forms the cutting groove 14 that penetrates the semiconductor wafer 10 in the depth direction Z, while the first dicing blade 31 scans along the dicing line 12. The first dicing may be performed sequentially for all the dicing lines 12 extending along the first direction X and sequentially for all the dicing lines 12 extending along the second direction Y. As a result, the cutting grooves 14 are formed in the semiconductor wafer 10, in a layout identical to the dicing lines, so as to surround in a grid-like shape, peripheries of the effective regions constituting the semiconductor chips 10', whereby the semiconductor wafer 10 is divided into the plural semiconductor chips 10'. FIGS. 4 and 5 depict a state in which the first dicing is performed for all the dicing lines 12 that extend along the second direction Y and thereafter, is performed for the dicing lines 12 that extend along the first direction X.

During the first dicing, a distance of the first dicing blade 31 and the dicing tape 21 may be adjusted so that cuts by the first dicing blade 31 enter dicing tape 21. A reason for this is that by lowering the first dicing blade 31 toward the stage 37 to a position at a height where cuts by the first dicing blade 31 enter the dicing tape 21, the semiconductor wafer 10 may be assuredly cleaved into the semiconductor chips 10'. A thickness t1 of the dicing tape 21, for example, may be about 90 µm. A cutting depth d1 toward the dicing tape 21 by the first dicing blade 31 may be, for example, about 15 µm. The cutting depth d1 toward the dicing tape 21 by the first dicing blade 31 and the height position of the first dicing blade 31 from the stage 37 are confirmed, thereby enabling a replacement time of the first dicing blade 31 to be determined.

Further, during the first dicing, cooling water (cutting water) 36 is discharged from a nozzle 35 at a contact point of the first dicing blade 31 and the semiconductor wafer 10. As a result, heat generated during cutting of the semiconductor wafer 10 is suppressed, enabling processing abnormalities due to heat generated during cutting of the semiconductor wafer 10 to be suppressed. Further, the first dicing, for example, is performed at room temperature (e.g., 23 degrees C., ±5 degrees C.). The first dicing may be a downward-cut in which a rotation direction 34 of the first dicing blade 31 is controlled so that the rotation direction is such that the first dicing blade 31 approaches the semiconductor wafer 10 at a rear of the first dicing blade 31, with respect to the advancement direction of the semiconductor wafer, or may be an upward-cut in which a rotation direction of the first dicing blade 31 is controlled so that the rotation direction is such that the first dicing blade 31 rotates away from the semiconductor wafer 10 at the rear of the first dicing blade 31. FIG. 4 depicts a case in which the first dicing is the upward-cut.

In particular, conditions of the first dicing may be conditions identical to those of conventional dicing by a single cut and, for example, may be the following conditions. The blade width w1 of the first dicing blade 31 may be, for example, in a range from about 30 μm to 50 μm. A reason for this is that the thinner the blade width (blade thickness) w1 of the first dicing blade 31 is, the lower the durability of the first dicing blade 31 is. Further, the thicker the blade width w1 of the first dicing blade 31 is, the lower the yield of the semiconductor chips 10' diced from a single wafer of the semiconductor wafer 10 is.

Mesh size of the diamond grit of the first dicing blade 31 may be, for example, about #2000, which is equal to that of a dicing blade used in a conventional dicing method by a single cut. Mean grit size of the diamond grit of a mesh size of about #2000 is, for example, about 6 μm. Further, the mesh size of the diamond grit of the first dicing blade 31 may be smaller or larger as compared to that of a dicing blade used in a conventional dicing method by a single cut. In particular, the mesh size of the diamond grit of the first dicing blade 31 may be, for example, in a range from about #1500 to #2500.

When a bearing mechanism of the first dicing blade 31 is a bearing type in which the first spindle is rotated by ball bearings, rotational speed of the first dicing blade 31 may about 8000 rpm (revolutions per minute), which is equal to a rotational speed of a dicing blade used in a conventional method by a single cut. When the bearing mechanism of the first dicing blade 31 is an air spindle type in which the first dicing blade 31 rotates in a floating state by air, the rotational speed of the first dicing blade 31 may greater than the rotational speed of the bearing type and, for example, may be in a range from about 20000 rpm to 30000 rpm. The higher the rotational speed of the first dicing blade 31 is, the greater surface roughness of side wall of the cutting groove 14 may be reduced and the greater the cutting speed may be increased. However, the higher the rotational speed of the first dicing blade 31 is, the wider a width w11 of the cutting groove 14 becomes. Therefore, the rotational speed of the first dicing blade 31 may be suitably set to obtain a predetermined surface roughness of the side walls of the cutting groove 14 and a predetermined width w11 of the cutting groove 14.

During the first dicing, ultrasonic output for applying ultrasonic vibration to the first dicing blade 31 may be, for example, about 20 W, which is equal to ultrasonic output of a conventional dicing method by a single cut. The higher the ultrasonic output is, the wider the width w11 of the cutting groove 14 by the first dicing blade 31 becomes and the yield of the semiconductor chip 10' decreases. However, the ultrasonic output for applying ultrasonic vibration to the first dicing blade 31 may be higher than the ultrasonic output of a conventional dicing method of a single cut. The higher the ultrasonic output is for applying ultrasonic vibration to the first dicing blade 31, the greater the required dicing time per unit number of the semiconductor wafer 10 may be shortened.

The cutting speed of the first dicing blade 31 may be, for example, about 10 mm/s, which is equal to a cutting speed of the dicing blade used in a conventional dicing method by a single cut, or may be, for example, about 20 mm/s, which is higher than the cutting speed of the dicing blade used in a conventional dicing method by a single cut. The cutting speed of the dicing blade is a movement speed of the stage 37.

During the first dicing, the ultrasonic output for applying ultrasonic vibration to the first dicing blade 31 is increased and the cutting speed of the first dicing blade 31 is increased, whereby even when cracks occurring in the side wall of the cutting groove increase, the cracks are reduced by the subsequent second dicing and the side walls of the cutting groove becomes substantially specular. Therefore, cracks generated by the first dicing blade 31 substantially do not remain at the side surfaces of the completed semiconductor chip 10'.

Next, the side walls of the cutting groove 14 are polished using the second dicing blade 41 (hereinafter, the second dicing). In particular, during the second dicing, the second dicing blade 41 is arranged so that the side surfaces of the second dicing blade 41 are parallel to the dicing line 12 and the second dicing blade 41 is rotated at a high speed by a second spindle, via a second blade horn 42. In this state, the second dicing blade 41 is inserted in the cutting groove 14. Then, the stage 37 is moved in a same direction 43 as the direction along which the dicing line 12 extends in a straight line and the second dicing blade 41 is scanned along the dicing line 12, whereby the side walls of the cutting groove 14 are polished. The second dicing is sequentially performed for all the dicing lines 12 that extend along the first direction X and is sequentially performed for all the dicing lines 12 extending along the second direction Y. FIGS. 6 and 7 depict a state in which the second dicing is performed with respect to the dicing lines 12 that extend along the first direction X.

The second dicing blade 41 is, for example, a thin, disk-shaped grinding wheel having diamond grit (diamond particles) hardened by general electroforrning. The second dicing blade 41 is fixed to the second spindle, via the second blade horn 42, in a state enabling rotation around the non-depicted second spindle as an axis of rotation. The second blade horn 42 is disposed at a center of the second dicing blade 41 so as to sandwich the second dicing blade 41 with the second blade horn 42 being in contact with both side surfaces of the second dicing blade 41 and fixing the second dicing blade 41 to the second spindle. The side surfaces of the second dicing blade 41 are surfaces that are orthogonal to a direction of the blade width w2 of the second dicing blade 41. The second blade horn 42 has a function of reinforcing the strength of the second dicing blade 41 along the direction of the blade width w2. The second blade horn 42, for example, has a disk-like shape having a radius that is about 1.5 mm smaller than a radius of the first dicing blade 31.

The blade width w2 of the second dicing, blade 41 wider than the blade width w1 of the first dicing blade 31. As a result, by merely scanning the second dicing blade 41 along the dicing lines 12 so as to pass inside the cutting grooves 14, the side walls of the cutting grooves 14 constituting the side surfaces 10c' of the semiconductor chip 10' may be polished. The mesh size of the diamond grit of the second dicing blade 41 is larger than the mesh size of the diamond grit of the first dicing blade 31 In other words, the mean grit size of the diamond grit of the second dicing blade 41 is smaller than the mean grit size of the diamond grit of the first dicing blade 31. As a result, the surface roughness of the side walls of the cutting grooves 14 may be reduced as compared to that before the second dicing and may approach a specular state.

In particular, the blade width w2 of the second dicing blade 41 is wider than the blade width w1 of the first dicing blade 31 by about, for example, +2 µm to +15 µm. The blade width w2 of the second dicing blade 41 is made wider than the blade width w1 of the first dicing blade 31, whereby cracks that are recesses of about 100 nm to 200 nm occurring in the side walls of the cutting grooves 14 due to the first dicing are removed, enabling the side walls of the cutting grooves 14 to be made specular surfaces. The blade width w2 of the second dicing blade 41 may be wider than the blade width w1 of the first dicing blade 31 by about, for example, +3 µm to +7 µm. As a result, the cutting resistance to the second dicing blade 41 may be reduced. Further, the blade width w2 of the second dicing blade 41 may be wider than the blade width w1 of the first dicing blade 31 by about, for example, +5 µm. The mesh size of the diamond grit of the second dicing blade 41 is larger than the mesh size of the diamond grit of the first dicing blade 31 and, for example, may be in a range from about #3000 to #4000.

Conditions of the second dicing excluding the blade width w2 of the second dicing blade 41 and the mesh size of the diamond grit of the second dicing blade 41 may be identical to those of the first dicing or may be suitably adjusted. In particular, during the second dicing, a distance from the second dicing blade 41 to the stage 37 may be adjusted so that cuts by the second dicing blade 41 enter the dicing tape 21. As a result, the side walls of the cutting grooves 14 ay be assuredly polished by the second dicing blade 41 entirely.

During the second dicing, the cooling water 36 is discharged from the nozzle 35 at a contact point of the second dicing blade 41 and the semiconductor wafer 10, enabling processing abnormalities to be prevented that occur due to heat generated during cutting of the semiconductor wafer 10. A rotation direction 44 of the second dicing blade 41 may be controlled so that the second dicing is the downward-cut or may controlled so that the second dicing is the upward-cut. FIG. 6 depicts a case in which the second dicing is the upward-cut., The second dicing is performed at, for example, room temperature.

Further, during the second dicing, ultrasonic vibration needs not be applied to the second dicing blade 41, When ultrasonic vibration is applied to the second dicing blade 41 during the second dicing, ultrasonic vibration that is equal to or less than the ultrasonic vibration applied to the first dicing blade 31 during the first dicing may be applied to the second dicing blade 41. in other words, during the second dicing, ultrasonic output for applying ultrasonic vibration to the second dicing blade 41 may be, for example, in a range from about 0 W to 20 W. When ultrasonic vibration is applied to the second dicing blade 41 during the second dicing, the side walls of the cutting grooves 14 are polished by projections of the abrasive grains on the surfaces of the second dicing blade 41.

A cutting speed of the second dicing blade 41 may be equal to the cutting speed of the first dicing blade 31. While the cutting speed of the second dicing blade 41 may be reduced to be lower than the cutting speed of the first dicing blade 31 to reduce the cutting resistance to the second dicing blade 41, the lower the culling speed of the second dicing blade 41 is, the lower the productivity for the semiconductor chip 10' becomes. Therefore, when stress is applied to the semiconductor chip 10', the cutting speed of the second dicing blade 41 may be increased to an extent that the semiconductor chip 10' is not destroyed and the cracks at the side surfaces of the semiconductor chip 10' disappear or become smaller.

A rotational speed of the second dicing blade 41 is equal to or higher than the rotational speed of the dicing blade used in a conventional dicing method by a single cut. In particular, when the bearing mechanism of the second dicing blade 41 is a bearing type, the rotational speed of the second dicing blade 41 is, for example, about 8000 rpm or higher, When the bearing mechanism of the second dicing blade 41 is an air spindle type, the rotational speed of the second dicing blade 41 may be in a range, for example, from about 40000 rpm to 50000 rpm.

A dicing machine may be used that is capable of simultaneously scanning the first and the second dicing blades 31, 41 respectively along two of the dicing lines 12 that are parallel. In this case, the first and the second dicings are performed continuously for each of the dicing lines 12. The cutting speeds of the first and the second dicing blades 31, 41 are equal. Further, the first dicing may be performed continuously for all the dicing lines 12 of a single wafer of the semiconductor wafer 10 and thereafter, the second dicing may be performed continuously for all the dicing lines 12. In this case, a single dicing machine may be used in which the first and the second dicing blades 31, 41 are switched for the first and the second dicings, or two dicing machines may be used respectively disposed with the first and the second dicing blades 31, 41. The cutting speeds of the first and the second dicing blades 31, 41 may differ.

By performing the first and the second dicings in this manner, the semiconductor chip 10' depicted in FIG. 1 is completed. Thereafter, the semiconductor chips 10' cleaved from the semiconductor wafer 10 are picked up from the dicing tape 21 by a general method.

As described, according to the embodiment, the quality of the side surfaces of the semiconductor chips may be enhanced, enabling the strength of the semiconductor chips to be enhanced. As a result, a highly reliable semiconductor device may be provided for which the bending strength of the semiconductor chip is ensured. Additionally, the dicing speed of the semiconductor wafer may be increased, enabling the semiconductor chip productivity to be enhanced.

For example, with the conventional technique, micro-cracks are generated in the side walls of the cutting grooves by the dicing blade and the number of these micro-cracks increases, as the cutting depth becomes deeper into the side wags of the cutting grooves by the abrasive grains at the cutting edge of the dicing blade (i.e., the larger the mean grit size of the abrasive grains is). In contrast, according to the embodiment, after the semiconductor wafer is completely separated into individual semiconductor chips by the cutting grooves formed by the first dicing blade, the side surfaces of the semiconductor chips are polished by the second dicing blade that has a blade width that is wider than that of the first dicing blade. As a result, the micro-cracks formed at the side walls (i.e., the side surfaces of the semiconductor chips) of the cutting grooves by the first dicing blade may be eliminated or made smaller, enabling the quality of the side surfaces of the semiconductor chips to be enhanced.

Further, in the conventional technique, when a dicing blade having a small grit size is used and the cutting depth into the side walls of the cutting groove is made shallow to suppress the generation of micro-cracks, the semiconductor chip productivity decreases because the cutting resistance of the dicing blade increases and therefore, the cutting speed of the dicing blade is reduced to reduce the load to the dicing blade and thereby prevent damage of the dicing blade. Further, with the dicing that combines the use of ultrasonic vibration, the dicing blade not only vibrates along a direction orthogonal to a main surface of the semiconductor wafer but also in a direction (i.e., direction orthogonal to the side walls of the cutting groove) parallel to the main surface of the semiconductor wafer and therefore, the number of micro-cracks occurring in the side walls of the cutting groove increases.

In contrast, according to the embodiment, in the first dicing, the first dicing blade having a relatively large mean grit size may be used in high-speed processing in a range possible without concern for the quality of the side walls of the cutting groove and may be used in combination with ultrasonic vibration to form the cutting groove along the dicing line in the semiconductor wafer and separate the semiconductor wafer into semiconductor chips by the cutting groove. Thereafter, in the second dicing, micro-cracks in the side walls of the cutting groove may be reduced by the second dicing blade having a mean grit size that is smaller than that of the first dicing blade, whereby the side walls of the cutting groove become close to specular surfaces, enabling the quality of the side surfaces of the semiconductor chips to be enhanced.

Additionally, according to the embodiment, during the second dicing, the side walls of the cutting grooves are only polished by the second dicing blade and therefore, even when the second dicing blade having a relatively small mean grit size is used, the cutting resistance of the second dicing blade may be reduced. Therefore, even in the second dicing, high-speed processing is possible. Accordingly, the semiconductor wafer is processed, fabricating the individual semiconductor chips in two stages including the first dicing by the first dicing blade and the second dicing by the second dicing blade that has a mean grit size that is smaller than that of the first dicing blade, whereby both the dicing speed of the semiconductor wafer may be increased and micro-cracks at the side surfaces of the semiconductor chips may be suppressed.

The required dicing time per unit number of the semiconductor wafer 10 and bending fracture strength of the semiconductor chip 10' was verified. FIG. 8 is a table depicting a relationship of the required dicing time per unit number of the semiconductor wafers and the bending fracture strength of the semiconductor chips. FIG. 8 further depicts dicing conditions. In FIG. 8, average values of bending fracture strength of the semiconductor chips 10' (in FIG. 8, "chip bending fracture strength") are average values of bending fracture strength measured for all the semiconductor chips 10' cut from plural sites of a single wafer of the semiconductor wafer 10, four semiconductor chips 10' being cut from each of the sites. The sites from which the semiconductor chips 10' are cut from the semiconductor wafer 10 include a total of five sites: one site at a central part of the semiconductor wafer 10 and four sites each positioned at 90-degree central angles with the central part of the semiconductor wafer 10 as a center.

For each of the five sites from which the semiconductor chips 10' are cut, two of the four semiconductor chips 10' cut from the site are each placed on the stage 37 with the rear surface of the semiconductor chip 10' facing toward the stage 37 and the semiconductor chip 10' being supported at two points centered about a central part of the rear surface, by holding members on the stage 37. With the two points at which the semiconductor chip 10' supported at the rear surface by the holding members on the stage 37 as fulcrums, a load is applied from the front surface side to the central part, in a direction pushing the central part toward the stage 37 and thereby implementing a 3-point bending test, whereby the bending fracture strength (hereinafter, bending fracture strength when load is applied from the front surface side of the semiconductor chip 10') was measured. In this instance, the bending fracture strength was greatest at the central part on the rear surface side of the semiconductor chip 10'.

For each of the five sites from which the semiconductor chips 10' are cut, the other two of the four semiconductor chips 10' cut from the site are each placed on the stage 37 with the front surface of the semiconductor chip 10' facing toward the stage 37 with the semiconductor chip 10' being supported at two points centered about a central part of the front surface by the holding members on the stage 37. With the two points at which the semiconductor chip 10' is supported at the front surface by the holding members on the stage 37 as fulcrums, a load is applied from the rear surface side to the central part, in a direction pushing the central part toward the stage 37, thereby implementing the 3-point bending test, whereby the bending fracture strength (hereinafter. bending fracture strength when load is applied from the rear surface side of the semiconductor chip 10') was measured. In this instance, the bending fracture strength was greatest at the central part on the front surface side of the semiconductor chip 10'.

In FIG. 8, the average bending fracture strength of the semiconductor chip 10' is the average of all the bending fracture strengths of the semiconductor chip 10' when load is applied from the front surface side and all the bending fracture strengths of the semiconductor chip 10' when load is applied from the rear surface side. The average of all the bending fracture strengths of the semiconductor chip 10' when load is applied from the front surface side is indicated on a right side of a plot (point) on a vertical line of "front surface" of EXAMPLE depicted in FIG. 9 described hereinafter. The average bending fracture strength of the semiconductor chip 10' when load is applied from the rear surface side is depicted on a right side of a plot on a vertical line of "rear surface" of EXAMPLE depicted in FIG. 9.

In particular, according to the method of manufacturing a semiconductor device according to the embodiment. the semiconductor chips 10' (hereinafter, EXAMPLE) were fabricated by forming SBD element structures in each of the effective regions of the semiconductor wafer 10 and performing the first and the second dicings with respect to the semiconductor wafer 10. For EXAMPLE, the required dicing time per single wafer of the semiconductor wafer 10 (in FIG. 8, "required dicing time per single wafer"), and the average bending fracture strength of the semiconductor chip 10' are depicted in FIG. 8. In EXAMPLE, a dicing machine capable of simultaneously scanning the first and the second dicing blades 31, 41 respectively along two of the dicing lines 12 that are parallel was used, and the first and the second dicings were continuously performed for each of the dicing lines 12.

The first dicing conditions of EXAMPLE were as follows. The blade width w1 of the first dicing blade 31 was 40 μm. The mesh size of the diamond grit of the first dicing blade 31 was #2000. The rotational speed of the first dicing blade 31 by the first spindle was 8000 rpm. The ultrasonic output for applying ultrasonic vibration to the first dicing blade 31 was 20 W. The cutting speed of the first dicing blade 31 was 20 mm/s. The cutting depth toward the dicing tape 21 was 15 μm.

The second dicing conditions of EXAMPLE were as follows. The blade width w2 of the second dicing blade 41 was 45 μm. The mesh size of the diamond grit of the second dicing blade 41 was #3000. The rotational speed of the second dicing blade 41 by the second spindle was 8000 rpm. The ultrasonic output for applying ultrasonic vibration to the second dicing blade 41 was 0 W, i.e., ultrasonic vibration was not applied to the second dicing blade 41. The cutting speed of the second dicing blade 41 was 20 mm/s.

Further, in FIG. 8, for comparison, the required dicing time per unit number of semiconductor wafers and the average bending fracture strength of the semiconductor chips are depicted regarding a conventional example and a comparison example. In the conventional example, semiconductor chips were fabricated by forming SBD element structures in each of the effective regions a semiconductor wafer and dicing the semiconductor wafer by a conventional dicing method by a single cut. In the comparison example, semiconductor chips were fabricated by forming SBD element structures in each of the effective regions of a semiconductor wafer and dicing the semiconductor wafer by dicing by a single cut using a dicing blade having a bearing mechanism of an air spindle type. For the conventional example and the comparison example, the SBD element structures, dicing line layouts, sites where the semiconductor chips were cut from the semiconductor wafer, and the method of measuring the bending fracture strength of the semiconductor chips were identical to those for EXAMPLE.

Conditions of the conventional example excluding the cutting speed of the dicing blade were identical to the first dicing conditions of EXAMPLE. For the dicing in the conventional example, the cutting speed of the dicing blade was 10 mm/s. In the conventional example, dicing corresponding to the second dicing in EXAMPLE was not performed. Dicing conditions in the comparison example were as follows. In the comparison example, the blade width of the dicing blade was 50 μm, the mesh size of the diamond grit of the dicing blade was #2500, and the rotational speed of the dicing blade by the spindle was 50000 rpm. In the dicing of the comparison example, ultrasonic vibration was not applied to the dicing blade. In the comparison example, dicing corresponding to the second dicing of EXAMPLE was not performed.

From the results depicted in FIG. 8, it was confirmed that in EXAMPLE, the required dicing time per unit number of the semiconductor wafer 10 may be made about equal to that of the conventional example and the bending fracture strength of the semiconductor chip 10' may be made higher than that of the conventional example. Further, it was confirmed that in EXAMPLE, the required dicing time per unit number of the semiconductor wafer 10 may be made shorter than that of the comparison example and the bending fracture strength of the semiconductor chip 10' may be made higher than that of the comparison example.

Figure 9:
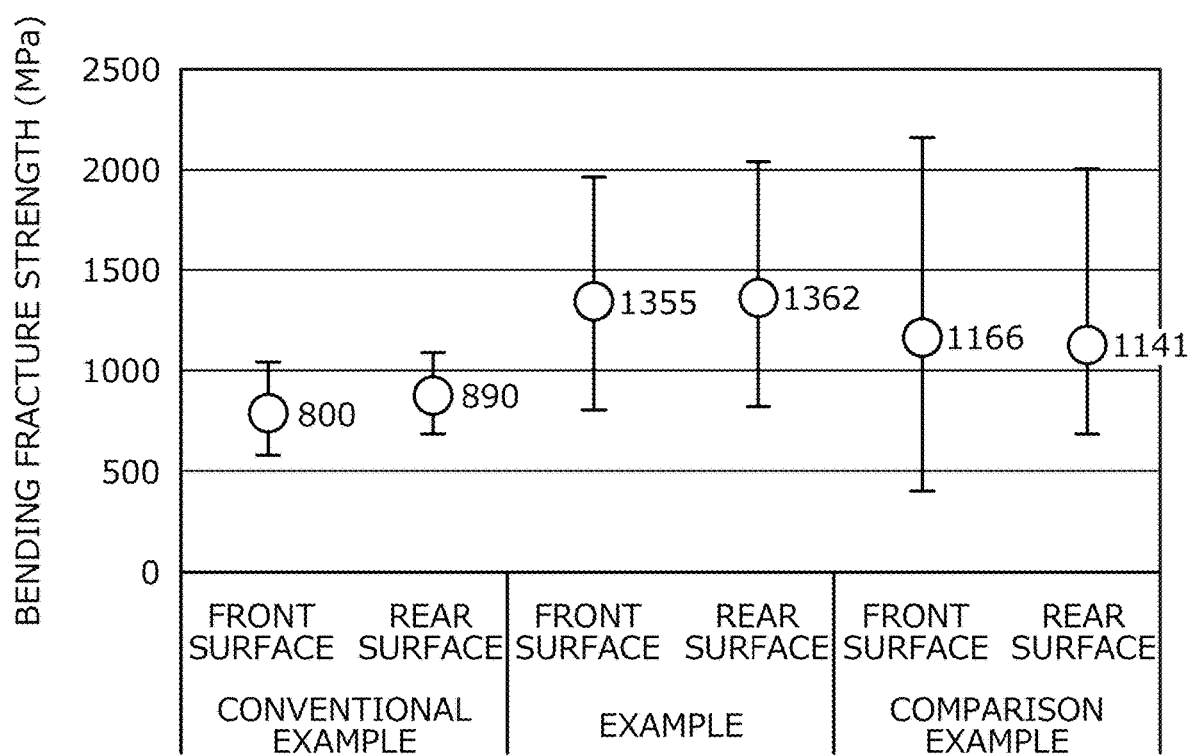
FIG. 9 is a characteristics diagram depicting bending fracture strength distribution of the semiconductor chips.

Reliability of the semiconductor chip 10' as confirmed FIG. 9 is a characteristics diagram depicting bending fracture strength distribution of the semiconductor chips. In FIG. 9, in each sample column, a right sub-column "front surface" indicates the bending fracture strength when load is applied from the front surface side of the semiconductor chip and a left sub-column "rear surface" indicates the bending fracture strength when load is applied from the rear surface side of the semiconductor chip, regarding the samples of EXAMPLE, the conventional example and the comparison example described above.

For the samples depicted in FIG. 9, a range of distribution of the bending fracture strengths of all the semiconductor chips used in the bending fracture strength measurement are indicated by a vertical line. In other words, the semiconductor chips used in the bending fracture strength measurement include a total of ten semiconductor chips, i.e., two chips cut from each of the described five sites of the semiconductor wafer. A plot (point) on the vertical line is the average bending fracture strength of all the semiconductor chips used in the bending fracture strength measurement and a numeric value indicated by the plot is indicated on the right side of the plot.

From the results depicted in FIG. 9, it was confirmed that in EXAMPLE, even when load is applied from any one of the main surface sides of the main surfaces of the semiconductor chip 10', an upper limit value of the distributed range of the bending fracture strengths measured for the semiconductor chips 10' cut from a single wafer of the semiconductor wafer 10 may be increased as compared to the conventional example. In other words, EXAMPLE was confirmed to have a high probability enabling the bending fracture strength of the semiconductor chip 10' to be increased as compared to the conventional example.

The bending fracture strength of the semiconductor chip 10' varies according to reliability test conditions of the semiconductor module and during assembly of the semiconductor module. Heat cycle tests and power cycle tests are examples of general reliability tests of a semiconductor module. Therefore, for example, EXAMPLE was found to be strong against thermal load of the operating environment and heat generated by operation of the semiconductor device (the semiconductor chip 10') and to have high reliability during high temperatures as compared to the conventional example.

Further, from the results depicted in FIG. 9, in EXAMPLE, it was confirmed that even when load is applied to any one of the main surface sides of the main surfaces of the semiconductor chip 10', a lower limit of the distribution range of the bending fracture strengths measured for the semiconductor chips 10' cut from the single wafer of the semiconductor wafer 10 may be increased as compared to the comparison example. In other words, EXAMPLE was confirmed to have a lower probability of reducing the bending fracture strength of the semiconductor chip 10', as compared to the comparison example.

Further, while not depicted, in the conventional example, it was confirmed that a large quantity of micro-cracks having depths and widths corresponding to the particle size of the diamond grit of the dicing blade was formed at the side surfaces of the semiconductor chip. In the comparison example, it was confirmed that shallow scratches were formed at the side surfaces of the semiconductor chip by the diamond grit of the dicing blade. In contrast, in EXAMPLE, it was confirmed that the side surfaces of the semiconductor chip were substantially specular.

Thus, it was confirmed that EXAMPLE may increase reliability for the bending fracture strength of the semiconductor chip 10' to a greater extent than the conventional example and the comparison example. Further, it was confirmed that in EXAMPLE, substantially no difference between the bending fracture strengths of the respective sides of the semiconductor chip 10' occurs.

In the embodiments of the present invention, while description has been given taking, as an example, a SBD having a simple element structure, without limitation hereto, the present invention is applicable to other semiconductor devices such as a metal oxide semiconductor field effect transistor (MOSFET) that is a MOS-type field effect transistor having an insulated gate constituted by a 3-layer structure of a metal, an oxide film, and a semiconductor. Further, while a case in which SiC is used as a semiconductor material has been described as an example, the present invention is applicable even when the semiconductor device is fabricated using, as a material, a semiconductor material that, like SiC, is hard and difficult to process. A semiconductor material having a bandgap wider than that of Si such as, for example, gallium nitride (GaN) may be given an example of a semiconductor material that, like SiC, is hard and difficult to process.

The method of manufacturing a semiconductor device according to the embodiments of the present invention achieves an effect in that in dicing a semiconductor wafer by a dicing blade ultrasonically vibrated the strength of the semiconductor chip may be enhanced and semiconductor chip productivity may be enhanced.

As described, the method of manufacturing a semiconductor device according to the embodiments of the present invention is useful for semiconductor devices such as MOSFETs and SBDs that use a semiconductor substrate having a high hardness and in particular, is suitable for SiC semiconductor devices that use SiC as a semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device that uses a semiconductor wafer containing silicon carbide and having a first main surface where a dicing line is formed in a predetermined layout that surrounds a periphery of a region constituting a semiconductor chip, the method comprising:
   fixing the semiconductor wafer to a stage, in a state with a second main surface of the semiconductor wafer opposing the stage;
   forming a cutting groove by a first dicing blade, the cutting groove being formed in the semiconductor wafer, along the dicing line and reaching the second main surface from the first main surface, the semiconductor wafer being cut via the cutting groove and separated into the semiconductor chip whose periphery is surrounded by the cutting groove; and
   polishing a side wall of the cutting groove along the dicing line, the side wall being a side surface of the semiconductor chip and polished by a second dicing blade inserted in the cutting groove, wherein
   polishing the side wall includes using the second dicing blade that has a blade width wider than that of the first dicing blade.

2. The method according to claim 1, wherein
   polishing the side wall includes using the second dicing blade constituted by abrasive grains having a mean grit size smaller than that of the first dicing blade.

3. The method according to claim 1, wherein
   forming the cutting groove includes applying ultrasonic vibration to the first dicing blade, and forming the cutting groove by the first dicing blade vibrated in a direction orthogonal to the first main surface of the semiconductor wafer.

4. The method according to claim 1, wherein
   forming the cutting groove includes separating the semiconductor wafer into the semiconductor chip that has the side surface that is flat.

5. The method according to claim 1, wherein
   a rotational speed of the second dicing blade is higher than a rotational speed of the first dicing blade.

6. The method according to claim 1, wherein
   a cutting speed of the second dicing blade is equal to a cutting speed of the first dicing blade.

7. The method according to claim 1, wherein
   a cutting speed of the second dicing blade is lower than a cutting speed, of the first dicing blade.

8. The method according to claim 1, wherein
   in polishing the side wall, the side wall of the cutting groove approaches a specular state.

9. The method according to claim 1, wherein
   a blade width of the second dicing blade is wider than a blade width of the first dicing blade by a range from +2 μm to +15 μm.

10. The method according to claim 9, wherein the blade width of the second dicing blade is wider than the blade width of the first dicing blade by a range of +3 μm to +7 μm.

11. The method according to claim 2, wherein
    a mesh size for the first dicing blade is in range from #1500 to #2500, and
    a mesh size for the second dicing blade is in a range from #3000 to #4000.

12. The method according to claim 1, wherein
    forming the cutting groove includes using the first dicing blade constituted by diamond grit.

13. The method according to claim 1, wherein polishing the side wall includes using the second dicing blade constituted by diamond grit.

14. The method according to claim 1, wherein
    fixing the semiconductor wafer to the stage includes:
      adhering the second main surface of the semiconductor wafer to a dicing frame via dicing tape, and
      fixing the semiconductor wafer to the stage via the dicing frame, and
    forming the cutting groove includes deepening a depth of the cutting groove until a cut by the first dicing blade enters the dicing tape.

15. The method according to claim 1 and further comprising:
    before fixing the semiconductor wafer to the stage.
      forming a predetermined element structure in the region constituting the semiconductor chip;
      forming the dicing line at the first main surface of the semiconductor wafer;
      selectively forming at the first main surface of the semiconductor wafer, a first electrode film in the region constituting the semiconductor chip; and
      forming a second electrode film on the entire second main surface of the semiconductor wafer.

* * * * *

UNITED STATES PATENT AND TRADEMARK OFFICE
CERTIFICATE OF CORRECTION

PATENT NO. : 10,636,708 B2
APPLICATION NO. : 16/253503
DATED : April 28, 2020
INVENTOR(S) : Takashi Shimada It is certified that error appears in the above-identified patent and that said Letters Patent is hereby corrected as shown below:

In the Claims

Column 18, Line 19 (Claim 7):
Delete "speed," and insert -- speed --, therefor.

Column 18, Line 52 (Claim 15):
Delete "stage." and insert -- stage, --, therefor.

Signed and Sealed this
Twenty-eighth Day of July, 2020

Andrei Iancu
*Director of the United States Patent and Trademark Office*